US 9,541,603 B2

(12) United States Patent
Park et al.

(10) Patent No.: US 9,541,603 B2
(45) Date of Patent: Jan. 10, 2017

(54) METHOD AND APPARATUS FOR POWER GLITCH DETECTION IN INTEGRATED CIRCUITS

(71) Applicant: Apple Inc., Cupertino, CA (US)

(72) Inventors: Brian S. Park, San Jose, CA (US); Patrick D. McNamara, San Francisco, CA (US); Kwang M. Lee, Saratoga, CA (US); Meng C. Chong, Milpitas, CA (US); Geertjan Joordens, Sunnyvale, CA (US); Raman S. Thiara, San Jose, CA (US); Anh T. Hoang, Fremont, CA (US); John P. Gonzalez, San Jose, CA (US)

(73) Assignee: Apple Inc., Cupertino, CA (US)

( * ) Notice: Subject to any disclaimer, the term of this patent is extended or adjusted under 35 U.S.C. 154(b) by 88 days.

(21) Appl. No.: 13/938,901

(22) Filed: Jul. 10, 2013

(65) Prior Publication Data

US 2015/0015283 A1 Jan. 15, 2015

(51) Int. Cl.
*G01R 31/00* (2006.01)
*G01R 31/317* (2006.01)
*G01R 19/165* (2006.01)
*G06F 1/28* (2006.01)
*G01R 31/3181* (2006.01)

(52) U.S. Cl.
CPC ... *G01R 31/31721* (2013.01); *G01R 19/16552* (2013.01); *G01R 31/31816* (2013.01); *G06F 1/28* (2013.01)

(58) Field of Classification Search
None
See application file for complete search history.

(56) References Cited

U.S. PATENT DOCUMENTS 4,873,471 A * 10/1989 Dean ............... H05B 41/285
315/307
5,068,604 A 11/1991 Van De Lagemaat
(Continued)

FOREIGN PATENT DOCUMENTS

GB 2328094 1/1997

OTHER PUBLICATIONS

International Search Report and Written Opinion from PCT/US2014/043584, issued Sep. 30, 2014, Apple Inc., pp. 1-13.
(Continued)

*Primary Examiner* — Paresh Patel
(74) *Attorney, Agent, or Firm* — Meyertons, Hood, Kivlin, Kowert & Goetzel, P.C.; Erik A. Heter

(57) ABSTRACT

A method and apparatus for power glitch detection in IC's is disclosed. In one embodiment, a method includes a detection circuit in an IC detecting a voltage transient wherein a value of a supply voltage has at least momentarily fallen below a reference voltage value. Responsive thereto, the detection circuit may cause a logic value to be stored in a register indicating that the detection circuit has detected the supply voltage falling below the reference voltage. The IC may include a number of detection circuits coupled to the register, each of which may provide a corresponding indication of detecting the supply voltage falling below the reference voltage. The detection circuits may be placed at different locations, and thus reading the register may yield information indicating the locations where, if any, such voltage transients occurred.

17 Claims, 6 Drawing Sheets

(56) References Cited

U.S. PATENT DOCUMENTS

| | | | |
|---|---|---|---|
| 5,336,944 A * | 8/1994 | Fischer | G01R 19/1659 |
| | | | 324/133 |
| 5,705,944 A | 1/1998 | Mou et al. | |
| 6,377,083 B1 | 4/2002 | Takabayashi et al. | |
| 2007/0271473 A1 | 11/2007 | Hosomi | |
| 2011/0313700 A1 | 12/2011 | Kouno et al. | |
| 2012/0126781 A1 | 5/2012 | Narayanan et al. | |

OTHER PUBLICATIONS

Written Opinion, International Application No. PCT/US2014/043584, mailed Jun. 9, 2015, 7 pages.
International Preliminary Report on Patentabilitty in Application No. PCT/US2014/043584, mailed Sep. 25, 2015.
Office Action in ROC (Taiwan) Patent Application No. 103123846, issued Nov. 20, 2015.

* cited by examiner

METHOD AND APPARATUS FOR POWER GLITCH DETECTION IN INTEGRATED CIRCUITS

BACKGROUND

1. Technical Field

This disclosure is directed to integrated circuits, and more particularly, to the detection of power transients within integrated circuits.

2. Description of the Related Art

Integrated circuits (IC's) are typically tested at the end of the manufacturing process in order to verify their correct operation and to identify parts that are faulty. In addition, IC's may be tested during the design phase in order to find flaws in the design that are not apparent before it is committed to silicon.

Many different failure mechanisms may cause a particular instance of an IC to fail a test. In some cases, the failures may be hard failures. Examples of hard failures include faulty or inoperative transistors, unintentional short circuits, unintentional open circuits, and so forth. In other cases, failures may be soft failures. A soft failure may be defined as a failure that occurs in the operation of a circuit even though the components themselves are not faulty.

One source of soft failures is transients on supply voltage nodes. For example, the switching of a large number of circuits simultaneously can cause a momentary drop in the supply voltage (sometimes referred to as a droop, a glitch, or a di/dt event). As a result of the momentary drop in the supply voltage, some transistors may switch states when they are not intended to, while others may not switch states even though such switching is intended. Thus, even though the actual transistors of the IC meet specifications, a glitch in the supply voltage may nevertheless cause the IC to fail a test or otherwise enter an inoperative state from which the IC cannot recover.

SUMMARY

A method and apparatus for power glitch detection in IC's is disclosed. In one embodiment, a method includes a detection circuit in an IC detecting a voltage transient wherein a value of a supply voltage has at least momentarily fallen below a reference voltage value. Responsive thereto, the detection circuit may cause a logic value to be stored in a register indicating that the detection circuit has detected the supply voltage falling below the reference voltage. The IC may include a number of detection circuits coupled to the register, each of which may provide a corresponding indication of detecting the supply voltage falling below the reference voltage. The detection circuits may be placed at different locations, and thus reading the register may yield information indicating the locations where, if any, such voltage transients occurred.

A detection circuit may be implemented using a voltage comparator and a flip-flop. The voltage comparator may receive the supply voltage on one input, and the reference voltage on another input. The reference voltage may be a variable voltage. The output of the comparator may be coupled to a clock input of the flip-flop. A data input of the flip-flop may be coupled to a fixed voltage value. If the comparator detects that the supply voltage has fallen below the reference voltage, is may trigger a change of state of its corresponding output signal. Responsive to detecting the change of state of the output signal on its clock input, the flip-flop may correspondingly change the state of its output signal. This result may then be written to the register. Since the data input of the flip-flop is coupled to a fixed voltage, it may maintain its output state irrespective of subsequent changes to the supply voltage until a reset occurs from a source external thereto.

BRIEF DESCRIPTION OF THE DRAWINGS

The following detailed description makes reference to the accompanying drawings, which are now briefly described.

Figure 1:
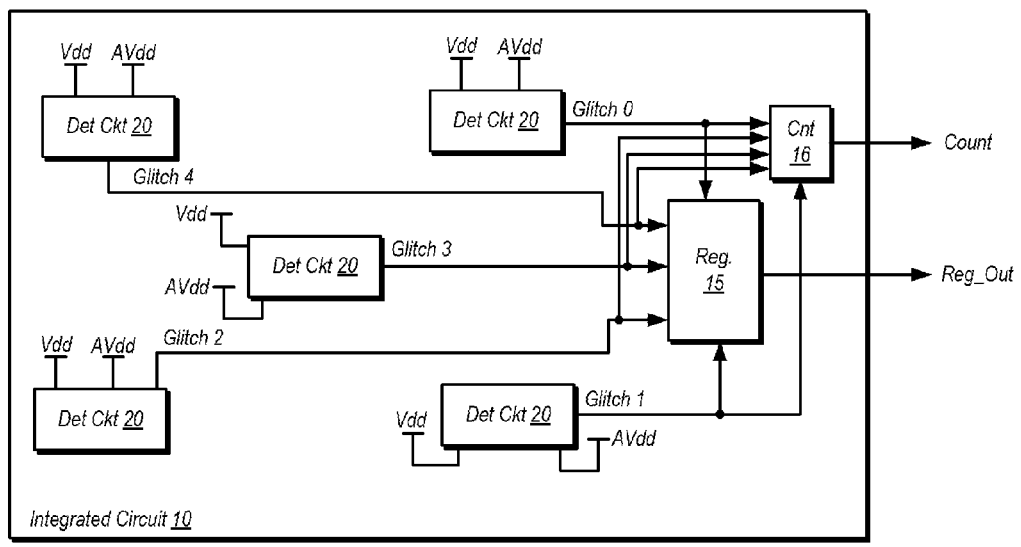
FIG. 1 is a block diagram of one embodiment of an IC.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an IC is shown. In the embodiment shown, IC 10 includes a number of detection circuits 20, each of which are coupled to register 15. It is noted that IC 10 may include other circuitry, such as one or more functional blocks configured to perform the action function of the IC. These blocks are not shown here for the sake of simplicity.

Each of detection circuits 20 in the embodiment shown is configured to detect glitches in the supply voltage, Vdd. As used herein, a glitch may be defined as a supply voltage transient which cause the supply voltage to fall below a certain voltage threshold (referred to herein as a reference voltage). The cause of a glitch may vary from one instance to the next. For example, a glitch may be caused by simultaneous switching noise, i.e. when a number of circuits switch at substantially the same time, thereby causing a significant change in the amount of current drawn from the supply voltage node. The results of a glitch can be erroneous operation of circuits, and in some cases, can cause circuits (if not the entire IC) to become inoperative.

Another aspect of power supply glitches is that they may be localized. For example, a glitch may occur at a location in an IC near a number of circuits that have recently switched states, while the supply voltage may remain substantially stable in another location of the IC that it sufficiently remote from the location where the glitch occurred. As such, the detection circuits 20 are implemented at different locations on IC 10. While it is noted that five instances of detection circuit 20 are shown here, any number of instances of detection circuit 20 may be implemented in various embodiments of an IC falling within the scope of this disclosure.

Each of the detection circuits 20 in the embodiment shown is coupled to receive two supply voltages, Vdd and AVdd (for 'analog Vdd'). The first supply voltage, Vdd, is the supply voltage used to supply circuits in the vicinity of detection circuit 20 (e.g., logic circuits in the vicinity), and is the voltage that is compared to a reference voltage, as explained in further detail below. The AVdd voltage is separate from Vdd, and is provided as a supply voltage to certain components within each detection circuit 20 to ensure their correct operation irrespective of any glitches in Vdd.

Each detection circuit 20 is configured to assert a corresponding glitch signal (e.g., 'Glitch 0', 'Glitch 1', etc.) in the event that a glitch is detected. The glitch signal asserted by a given detection circuit 20 may be received by register 15. Responsive to the assertion of a glitch signal by a given detection circuit, register 15 may record and store the occurrence. The contents of register 15 may be read from an entity external to IC 10 through the 'Reg_Out' output, which may be a serial or parallel output path. Analysis of the contents read from register 15 may provide information as to the location of supply voltage glitches. Such information can be obtained during post-silicon testing during the development phase, during manufacturing testing, and/or during failure analysis after a subsequent failure of IC 10 in the field. The information may be used to refine and improve the design of IC 10.

In the embodiment shown, IC 10 also includes a counter unit 16. Counter unit 16 may include a number of individual counters each corresponding to one of the detection circuits 20. The counters within counter unit 16 may track the number of glitches that occur from their corresponding detection circuits. For example, a number of tests of IC 10 may be performed on an IC test system, with the counters of counter unit 16 determining a number of glitches detected by each detection circuit 20. In order to facilitate such testing, each detection circuit 20 may be resettable. The count information may be useful in analyzing glitch-induced failures and determining conditions during which glitches occur, among other things.

Figure 2:
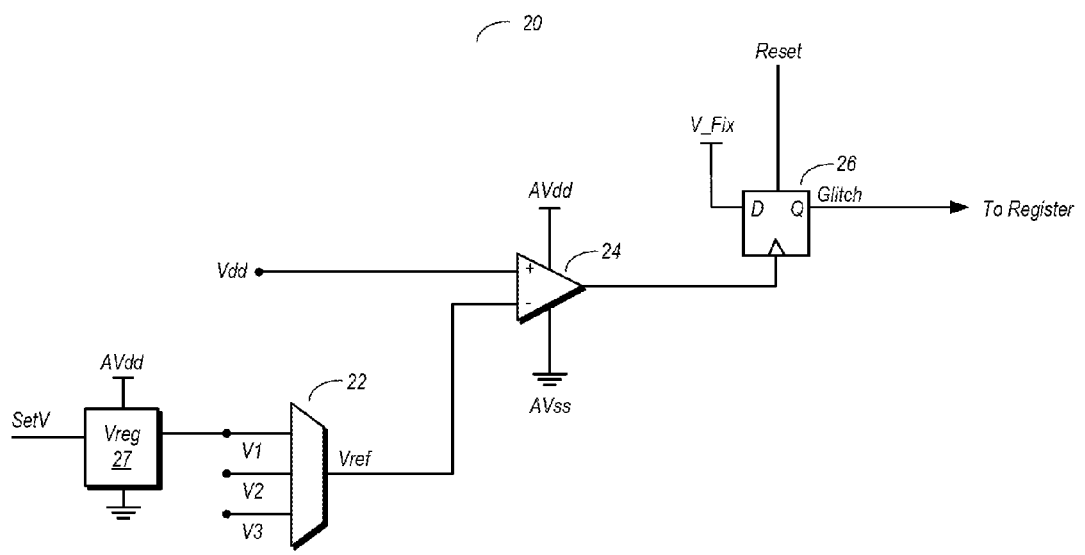
FIG. 2 is a schematic diagram of one embodiment of a detection circuit.

FIG. 2 is a schematic diagram of one embodiment of a detection circuit. In the embodiment shown, detection circuit 20 includes a comparator 24 coupled to receive on its inputs the supply voltage, Vdd, and a reference voltage, Vref. Comparator 24 is also coupled to receive AVdd as its operating voltage. The reference voltage may be received via selection circuit 22, and may be any one of voltage V1, V2, or V3 in this particular example. Voltages V1, V2, and V3 may be different from one another. Accordingly, the reference voltage may be varied, which may be useful in embodiments in which Vdd is also variable (e.g., in embodiments that use dynamic voltage and frequency scaling or otherwise adjust the supply voltage for different operating points). Furthermore, each of voltages V1, V2, and V3 may in and of itself be variable. In this particular example, voltage V1 is received from voltage regulator 27, which is a variable voltage regulator. The voltage output therefrom as voltage V1 may be varied according to the 'SetV' signal, which may be received from another source, internal or external, not shown here.

In an alternate embodiment not illustrated here, selection circuit 22 may be dispensed of, with Vref being coupled to a voltage regulator/generator to provide the reference voltage. In embodiments where Vdd does not change with operating state, Vref may be supplied to comparator as a substantially fixed voltage. As used herein, the term 'fixed voltage' may be defined as a voltage that is intended to remain at a predefined level (within a specified range, e.g., 5%) throughout operation of the circuit. Accordingly, the term 'fixed voltage' as used herein would exclude certain signals, such as logic signals in which the voltage is changed to indicate a change of state (e.g., where a logic 0 is 0 volts while a logic 1 is at Vdd).

The output of comparator 24 in the embodiment shown is coupled to a clock input of flip-flop 26. Flip-flop 26 in this embodiment is a D-type flip-flop, in which the state of the 'Q' output follows the 'D' input. At the beginning of operation, the 'Q' output ('Glitch') of flip-flop 26 may be low. When the supply voltage Vdd is greater than the reference voltage Vref in the embodiment shown, the output of comparator 24 may be low (e.g., at 0 volts, or ground). If a glitch causes Vdd to fall below Vref, the output of comparator 24 may transition high (e.g., to AVdd). When this change is detected on the clock input of flip-flop 26, the output thereof, 'Glitch', transitions high due to the 'D' input being hardwired to V_Fix. The transition high is detected by the register, which records and stores the instance of the glitch. Due to the configuration of flip-flop 26, the 'Glitch' signal may remain high until the 'Reset' signal is received in an asserted state from another source (not shown). The ability to reset flip-flop 26 may be useful in instance when a number of different tests are to be performed, e.g., using different reference voltages.

In embodiments in which Vref is variable, it may be possible to determine the magnitude of the glitch, or a reasonable approximation thereof. For example, consider a manufacturing test environment in which a glitch is detected during a certain test, with V1 provided as Vref. After the test has completed, flip-flop 26 may be reset, and the test may be conducted again with V2 provided as Vref, where V2 is less than V1. If the glitch is not detected with V2 provided as Vref, it can be determined that the magnitude of the glitch causes Vdd to fall somewhere between V1 and V2. On the other hand, if the glitch is detected when V2 is provided as Vref, flip-flop 26 may be reset and the test can be repeated again with V3 as provided as Vref. If the glitch does not occur, the magnitude can be determined cause Vdd to fall somewhere between V2 and V3. Otherwise, if the glitch occurs again, the magnitude thereof can be determined to cause the Vdd to fall below V3. Numerous other examples of determining the magnitude of a glitch are possible and contemplated (e.g., by varying the voltage of V1 output from voltage regulator 27), and may vary depending on the capabilities of the specific implementation of detection circuit 20 and IC 10.

Figure 3:
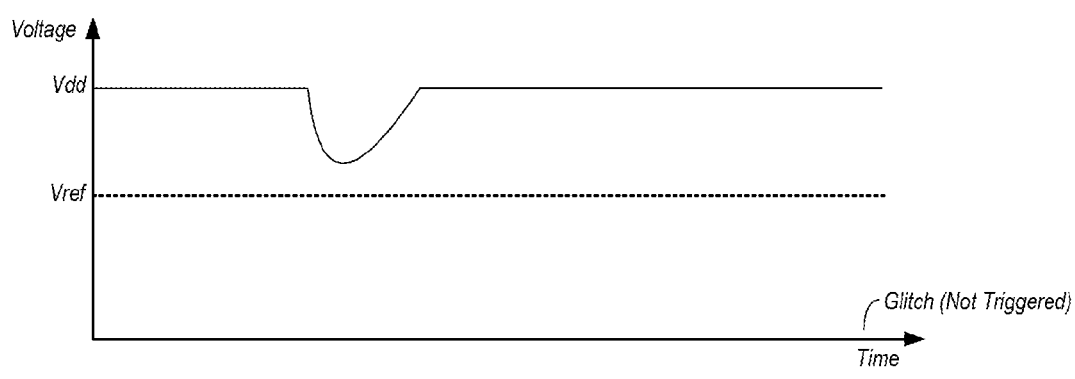
FIG. 3 is a graphical illustration of the detection of a supply voltage glitch.
Figure 3:
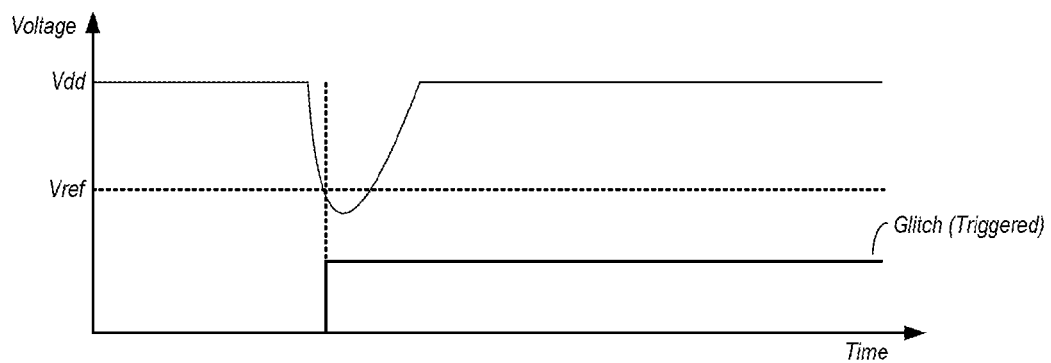

FIG. 3 includes graphics illustrations of the operation of detection circuit 20. In the upper graph, Vdd falls momentarily, but not enough to fall below Vref. Accordingly, no glitch has occurred, and the glitch signal is not triggered by the detection circuit 20. In the lower diagram, Vdd has momentarily fallen below Vref, and thus a glitch has occurred. Approximately at the moment Vdd falls below Vref, the glitch signal is triggered, and remains so for the remainder of this example.

Figure 4:
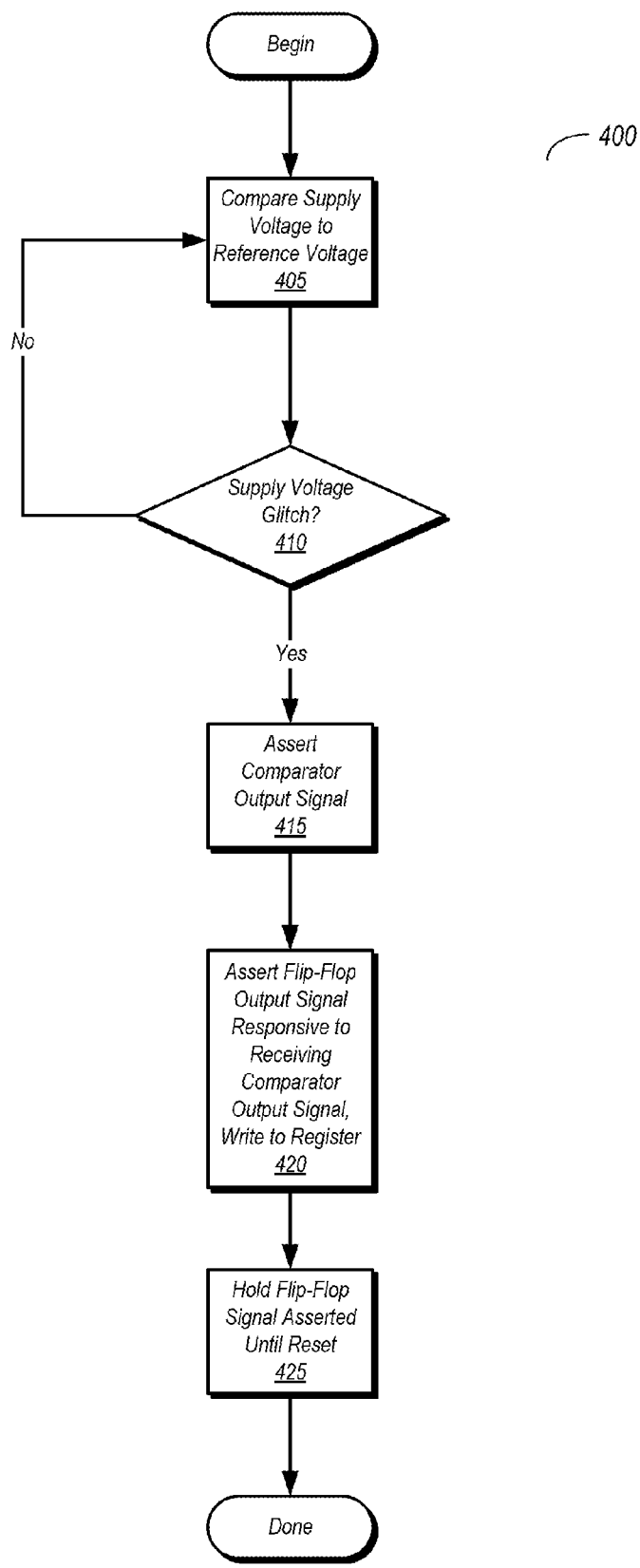
FIG. 4 is a flow diagram illustrating one embodiment of a method for detecting a supply voltage glitch.

Moving now to FIG. 4, a flow diagram illustrating one embodiment of a method for detecting a supply voltage glitch. Method 400 may be performed using detection circuit 20 and IC 10 as shown above. However, the methodology disclosed here is not limited to those hardware embodiments. In contrast, the performance of method 400 by a wide variety of hardware embodiments is possible and contemplated.

Method 400 begins with the comparing of the supply voltage to a reference voltage (block 405). If a voltage glitch has not occurred (block 410, no), then the method returns to block 405. If a voltage glitch does occur (block 410, yes), then the comparator may assert its output signal (block 415). The output signal may be received by a flip-flop (e.g., at its clock input as shown in FIG. 2), thereby causing it to assert its output signal (block 420). This may also cause a write to a register to record and store an indication of the occurrence of the glitch. The flip-flop signal may be held in an asserted state until a reset occurs (block 425).

Figure 5:
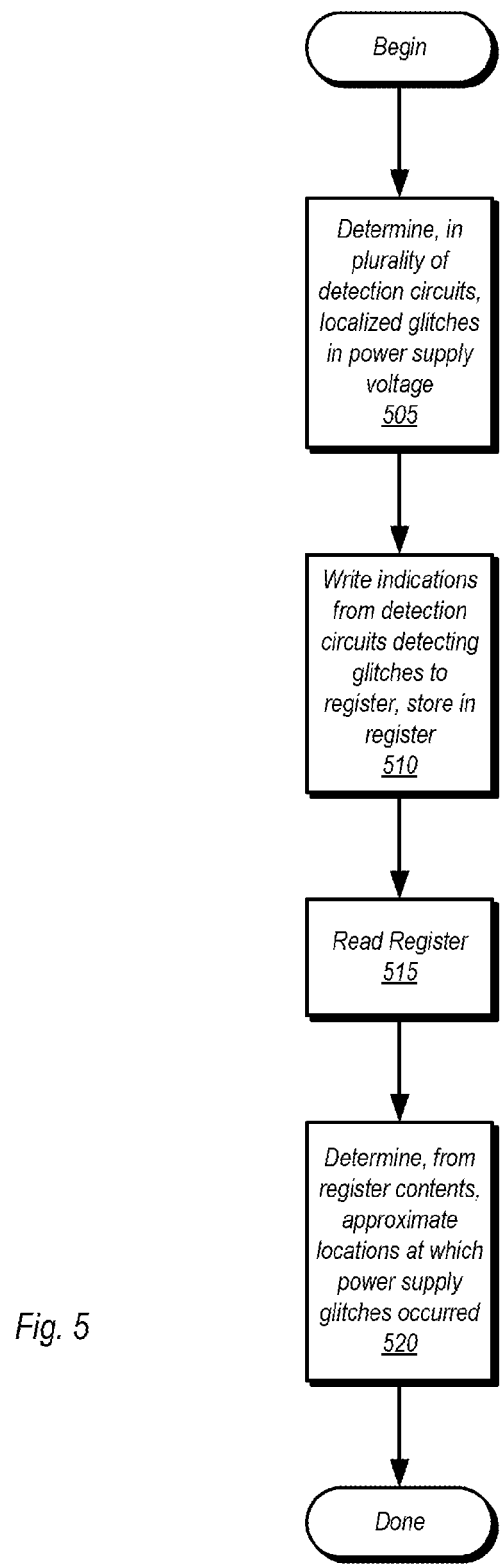
FIG. 5 is a flow diagram illustrating one embodiment of determining a location of a supply voltage glitch in an IC.

FIG. 5 is a flow diagram illustrating one embodiment of determining a location of a supply voltage glitch in an IC. Like method 400, the performance of method 500 may include the use of the hardware disclosed in FIGS. 1 and 2 and discussed above, but is not limited to those embodiments.

Method 500 begins with an IC determining, in a number of different locations (using a number of corresponding detection circuits), whether one or more glitches have occurred to a supply voltage (block 505). This determination may be made during a test (e.g., a manufacturing test) of the IC which includes the various detection circuits, but may also occur during normal operation in the field when a glitch causes the IC to become inoperative and thus requires replacement in its corresponding system.

For each glitch that occurs, an indication may be asserted, written and stored into a register which includes locations for storing such information (block 510). At some point thereafter, the contents of the register are read (block 515). From the register contents that are read, a determination can be made as to the locations at which the power supply glitches occurred (block 520). This may be made possible when the register locations are associated with particular locations of the detection circuits implemented in the IC.

Figure 6:
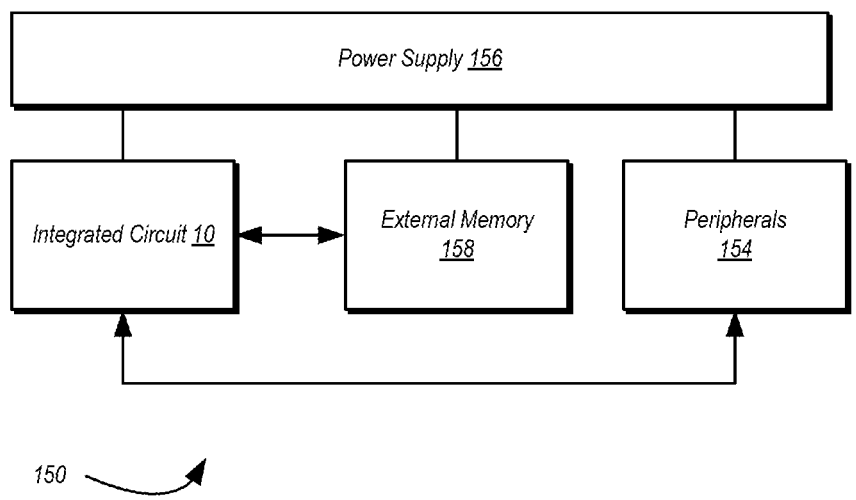
FIG. 6 is a block diagram of one embodiment of an exemplary system.

Turning next to FIG. 6, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A method comprising:
providing a logic signal from an output of a first comparator to a clock input of a first flip-flop;
storing, in a register, a logic value output by the first flip-flop;
comparing a first value of a reference voltage to a value of a supply voltage, wherein said comparing is performed by the first comparator;
changing a state of the logic signal output by the comparator responsive to determining that the value of the supply voltage is less than the first value of the reference voltage;
changing the logic value output by the flip-flop to a first logic value from a second logic value responsive to the comparator changing the state of the logic signal;
determining that the value of the supply voltage is greater than the first value of the reference voltage;
changing the reference voltage to a second value; and
repeating said comparing subsequent to changing the reference voltage to the second value.

2. The method as recited in claim 1, further comprising:
changing a state of the logic signal output by the comparator responsive to determining that the value of the supply voltage is less than the second value of the reference voltage; and
changing the logic value output by the flip-flop to a first logic value from a second logic value responsive to the comparator changing the state of the logic signal.

3. The method as recited in claim 1, further comprising maintaining the logic value output by the first flip-flop at the first logic value irrespective of the state of the logic signal output by the comparator subsequent to the comparator changing the state of the logic signal responsive to detecting that the supply voltage is less than the first value of the reference voltage.

4. The method as recited in claim 1, further comprising:
performing said comparing in each of a plurality of comparators, wherein the plurality of comparators includes the first comparator; and
providing respective logic signals from any of the plurality of comparators that detect that the value of the supply voltage is less than the first value of reference voltage, wherein the respective logic signals are provided to correspondingly coupled ones of a plurality of flip-flops, the plurality of flip flops including the first flip-flop.

5. The method as recited in claim 4, further comprising:
storing, in the register, logic values output by each of the plurality of flip-flops;
reading the register to determine which of the plurality of flip-flops has output a logic value of the first logic state; and
determining locations in the an integrated circuit, if any, where the supply voltage has fallen below the first value of the reference voltage based on said reading.

6. The method as recited in claim 1, further comprising:
performing said comparing for each of a plurality of values of the reference voltage;
determining of the supply voltage falls below the reference voltage for each of the plurality of values of the reference voltage; and
recording any instances for the supply voltage falling below the reference voltage.

7. The method as recited in claim 6, further comprising:
determining a magnitude of the temporary drop in the supply voltage based on said recording.

8. The method as recited in claim 1, further comprising:
resetting the first flip-flop to output the second logic value;
changing the reference voltage to a second value; and
repeating said comparing subsequent to changing the reference voltage to the second value.

9. An apparatus comprising:
a multiplexer coupled to receive a plurality of reference voltages including a first reference voltage;
a comparator coupled to receive one of the plurality of reference voltages from an output of the multiplexer on a first comparator input and a supply voltage on a second comparator input;
a flip-flop having a clock input coupled to receive a logic signal from the comparator; and
a register coupled to receive and configured to store a logic output from the flip-flop, wherein:
the comparator is configured to change a state of the logic signal output by the comparator responsive to determining that the value of the supply voltage is less than the first reference voltage;
the flip-flop is configured to change a value of the logic output to a first logic value from a second logic value responsive to the comparator changing the state of the logic signal; and
the multiplexer is configured to select each remaining one of the plurality of reference voltages to cause the comparator to compare the supply voltage to each remaining one of the plurality of reference voltages and determine if the supply voltage falls below any one of the plurality of reference voltages, wherein the comparator and flip-flop are configured to cause any instances of the supply voltage being less than the reference voltage to be recorded in the register.

10. The apparatus as recited in claim 9, wherein the flip-flop is configured to maintain its logic output at the first logic value irrespective of a state of the logic signal output by the comparator subsequent to the comparator changing the state of the logic signal responsive to detecting that the supply voltage is less than the first value of the reference voltage.

11. A method comprising:
providing a logic signal from an output of a first comparator to a clock input of a first flip-flop;
storing, in a register, a logic value output by the first flip-flop;
comparing a first value of a reference voltage to a value of a supply voltage, wherein said comparing is performed by the first comparator;
changing a state of the logic signal output by the comparator responsive to determining that the value of the supply voltage is less than the first value of the reference voltage;
changing the logic value output by the flip-flop to a first logic value from a second logic value responsive to the comparator changing the state of the logic signal;
resetting the first flip-flop to output the second logic value;
changing the reference voltage to a second value; and
repeating said comparing subsequent to changing the reference voltage to the second value.

12. An integrated circuit comprising:
a plurality of detection circuits each configured to detect voltage transients on a supply voltage node in which a supply voltage temporarily falls below a reference voltage, wherein each of the detection circuits includes:
a multiplexer having a plurality of inputs each coupled to receive a corresponding one of a plurality of reference voltages;
a comparator configured to compare a value of a supply voltage to one of the plurality of reference voltages received from the multiplexer and configured to change a state of an output signal responsive to determining that the supply voltage is less than the one of the plurality of reference voltages; and
a flip-flop having a clock input coupled to receive the output signal from the comparator and a data input coupled to a fixed voltage, wherein the flip-flop is configured to change a logic value output therefrom to a first state from a second state responsive to the comparator changing the state of the its output signal; and
a register coupled to receive and store a logic value from each the flip-flop of each of the plurality of detection circuits,
wherein the multiplexer is configured to select each remaining one of the plurality of reference voltages to cause the comparator to compare the supply voltage to each remaining one of the plurality of reference voltages, wherein the comparator and the flip-flop are configured to cause any instance of the supply voltage being less than a given one of the plurality of reference voltages to be recorded in the register.

13. The integrated circuit as recited in claim 12, wherein the flip-flop of each of the plurality of detection circuits is configured to maintain the logic value output therefrom at the first value subsequent to changing from the second value irrespective of a state of the signal output from its correspondingly coupled comparator.

14. The integrated circuit as recited in claim 13, wherein the flip-flop of each of the plurality of detection circuits includes an asynchronous reset input, wherein the flip-flop of each of the plurality detection circuit is configured to change the logic value output therefrom to the second value from the first value responsive to assertion of a reset signal on its asynchronous reset input.

15. A method comprising:
   determining, in one or more of a plurality of detection circuits in an integrated circuit, an occurrence of a transient on a supply voltage node causing a value of a supply voltage to temporarily fall below a value of a reference voltage, wherein determining the occurrence of the transient comprises comparing, using a comparator, the value of the supply voltage to the first value of the reference voltage and providing, from an output of the comparator, an indication to a clock input of a flip-flop responsive to the comparator determining that the value of the supply voltage has fallen below the value of the reference voltage;
   writing, to a register, an indication of detecting the transient on the supply voltage node from each of the plurality of detection circuits that detects the transient;
   identifying which of the one or more of the plurality of detection circuits detected the transient on the supply voltage node;
   determining one or more locations within the integrated circuit where the transient occurred on the supply voltage node;
   wherein the method further comprises determining, in one or more of the plurality of detection circuits in an integrated circuit, an occurrence of a transient on a supply voltage node for two or more values of the reference voltage.

16. The method as recited in claim 15, wherein said determining one or more locations comprises reading the register.

17. The method as recited in claim 15, further comprising determining a magnitude of the voltage transient on the supply voltage node, wherein the magnitude of the transient is the amount of fall of the supply voltage from a specified value.

* * * * *